United States Patent [19]
Schwartz et al.

[11] Patent Number: 5,854,797
[45] Date of Patent: Dec. 29, 1998

[54] TESTER WITH FAST REFIRE RECOVERY TIME

[75] Inventors: Martin J. Schwartz, Worcester, Mass.; Gerald F. Muething, Jr., Melbourne, Fla.

[73] Assignee: Teradyne, Inc., Boston, Mass.

[21] Appl. No.: 906,533

[22] Filed: Aug. 5, 1997

[51] Int. Cl.$^6$ .................................................. H04B 17/00
[52] U.S. Cl. ............................ 371/22.1; 371/1; 371/2.1; 371/62
[58] Field of Search .................................. 371/22.1, 2.1, 371/1, 57.2, 57.1, 27.7, 62

[56] References Cited

U.S. PATENT DOCUMENTS

| | | | |
|---|---|---|---|
| 5,146,121 | 9/1992 | Searles et al. | 307/603 |
| 5,214,680 | 5/1993 | Gutierrez, Jr. et al. | 377/20 |
| 5,243,227 | 9/1993 | Gutierrez, Jr. et al. | 307/605 |
| 5,283,631 | 2/1994 | Koerner et al. | 307/451 |
| 5,365,130 | 11/1994 | Murray et al. | 327/278 |
| 5,486,783 | 1/1996 | Baumert et al. | 327/147 |
| 5,566,188 | 10/1996 | Robbins et al. | 371/27.7 |

FOREIGN PATENT DOCUMENTS

| | | | | |
|---|---|---|---|---|
| WO 97/22916 | 6/1997 | WIPO | | G06F 1/04 |
| WO 97/25664 | 7/1997 | WIPO | | G06F 1/12 |
| WO 97/25795 | 7/1997 | WIPO | | H04L 7/00 |
| WO/9725796 | 7/1997 | WIPO | | H04L 7/00 |
| WO/9725797 | 7/1997 | WIPO | | H04L 7/00 |

OTHER PUBLICATIONS

"High–Speed Communication IC's: A Monolithic CMOS 10MHz DPLL for Burst–Mode Data Retiming," Feb. 16, 1990, Sonntag & Leonowich.

*Primary Examiner*—Phung M. Chung
*Attorney, Agent, or Firm*—Edmund J. Walsh

[57] ABSTRACT

Automatic test equipment for semiconductor devices. The automatic test equipment contains numerous channels of electronic circuitry in which precisely timed test signal are generated. Significant advantages in both cost and size are achieved by incorporating multiple channels on one integrated circuit chip. To allow this level of integration without degrading timing accuracy, a series of design techniques are employed. These techniques include the use of guard rings and guard layers, placement of circuit elements in relation to the guard rings and guard layers, separate signal traces for power and ground for each channel, and circuit designs that allow the voltage across a filter capacitor to define a correction signal. Another feature of the disclosed embodiment is a fine delay element design that can be controlled for delay variations and incorporates calibration features. A further disclosed feature is circuitry that allows the tester to have a short refire recovery time.

17 Claims, 8 Drawing Sheets

TESTER WITH FAST REFIRE RECOVERY TIME

This invention relates generally to automatic test equipment for semiconductors and more specifically to a semiconductor tester having small size and low cost achieved through the use of chips with high channel density.

During their manufacture, most semiconductor devices are tested at least once using some form of automated test equipment (generally, a "tester"). Modern semiconductor chips have numerous leads and, to fully test the semiconductor device, the tester must generate and measure signals for all of these leads simultaneously.

Modern testers generally have a "per-pin" architecture. A "pin" is circuitry within the tester that generates or measures one signal for the device under test. A "pin" is sometimes also called a "channel." In a per-pin architecture, each channel can be separately controlled to generate or measure a different signal. As a result, there are many channels inside one tester. The channels are controlled by a pattern generator. The main function of the pattern generator is to send commands to each channel to program it to generate or measure one test signal for each period of tester operation.

Each channel generally contains several edge generators, a driver/comparator and some format circuitry. Each edge generator is programmed to generate an edge signal (or more simply an "edge") at a certain time relative to the start of each period. The format circuitry receives digital commands from the pattern generator indicating what signal should be generated or measured during a period. Based on this information, the formatter combines the edges into on and off commands for the driver/comparator. In this way, the driver and comparator measures or generates the correct valued signal at the correct time.

Each edge generator is in turn made up of two basic pieces. It has a counter and a interpolator, each of which is programmable. The counter is clocked by a system clock. It is programmed to count some number of periods of the system clock. It is triggered to start counting at the start of a tester period. In general, the period of the system clock will be much smaller than the tester period so that the timing of edges within a tester period can be controlled fairly accurately simply by counting system clocks. However, if the time of the edge is determined solely by counting system clocks, the resolution with which the edge can be generated is the same as the period of the system clock. For testing many semiconductor components, this resolution is not fine enough. The interpolator is used to provide finer time resolution.

The interpolator delays the output of the counter by a programmable amount that is smaller than one period of the system clock. Thus, the resolution with which timing edges can be generated is limited by the resolution of the interpolator, rather than the period of the system clock.

Different semiconductors require different test patterns. Thus, automatic test equipment must be highly programmable. The values generated in each channel must be programmable as well as the times at which those signals are generated. However, one limit on how a test signal can be programmed is called the "refire recovery time." Hardware that is programmed to produce a timing edge needs some time between one timing edge and the next. It would be desirable for the refire recovery time to be as small as possible.

SUMMARY OF THE INVENTION

With the foregoing background in mind, it is an object of the invention to provide a tester with a fast refire recovery rate.

It is also an objective to provide a small and low cost tester with a fast refire recovery rate.

The foregoing and other objects are achieved in a tester that generates a periodic signal that is delayed relative to a master clock by a programmable amount. A gating signal is generated that selects one edge of the periodic signal as a timing edge.

In a preferred embodiment, the gating signal is generated by circuitry that contains a plurality of units, each of which can generate a control signal. Routing circuitry switches between the units in successive tester cycles.

In one embodiment, the trailing edge of the gating signal is used as a trigger to change the programmed values that control the delay of the periodic signal.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
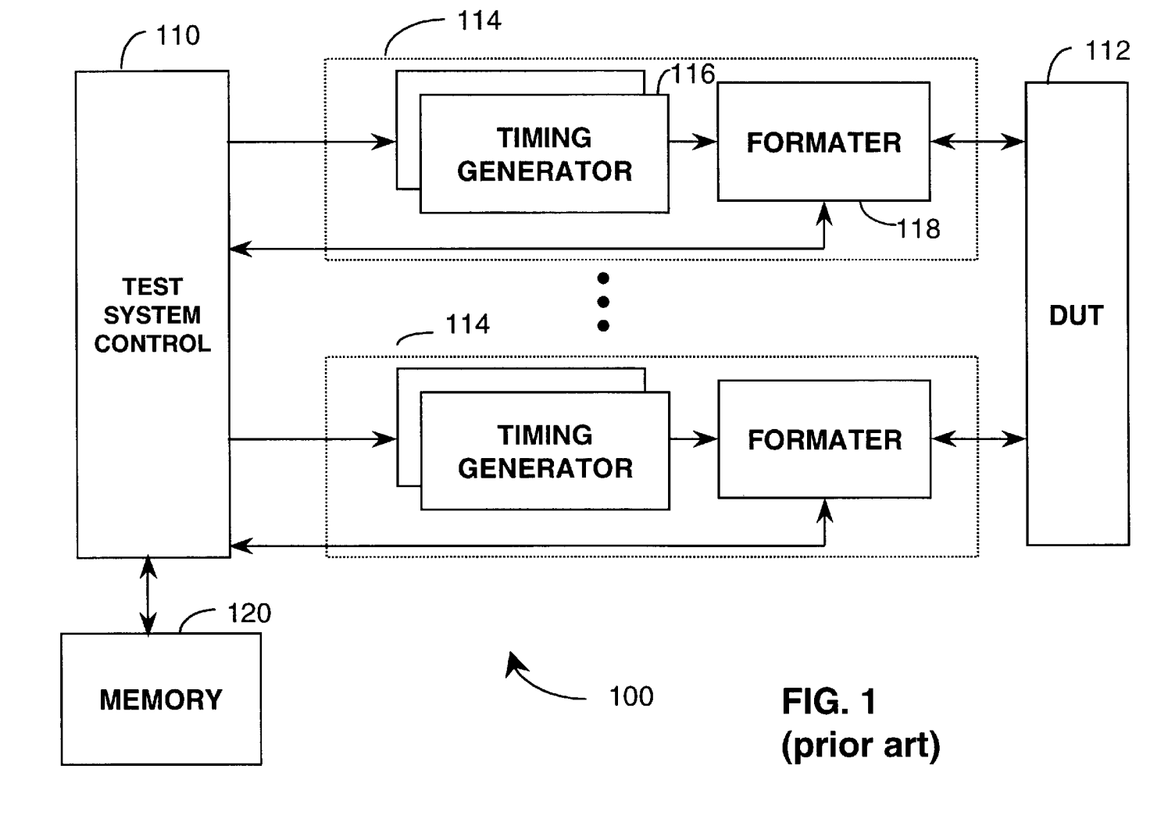
FIG. 1 is a sketch illustrating the architecture of a semiconductor tester.

FIG. 1 shows a tester 100 in simplified block diagram form. Tester 100 is controlled by a test system controller 110. Test system controller 110 generates digital control values for each channel of tester 100. The digital control values specify such things as when each channel should generate or measure a test signal, the value that should be generated and the format for that test signal.

Control information is provided for each cycle during which the tester operates. The data needed to specify what signals each channel should be generating or measuring for every cycle during a test is sometimes called a pattern. The pattern is stored in memory 120.

In addition to providing digital control values, test system controller 110 provides a timing signal that identifies that start of each tester cycle. This timing signal is sometimes called "T0" or "Beginning of Period" (BOP). Other parts of the tester that operate on a per cycle basis are triggered by the T0 signal.

The digital control values, as well as the T0 signal, are provided to a plurality of channels 114. A typical tester has between 64 and 1024 channels. However, the number of channels is not important to the invention. Each channel generally contains the same circuitry.

Within each channel 114 are a plurality of timing generators 116. Each timing generator 116 generates a timing edge that controls the time of an event within tester 100. The events might be such things as the start of a test pulse applied to a device under test 112 or the end of the test pulse. An edge might also be used to trigger measurement of a signal from device under test 112.

The time at which a timing edge should occur is specified relative to the start of the cycle. The timing data therefore indicates the amount of delay after the T0 signal when the timing edge is to be generated. In a preferred embodiment, the timing information is specified by several groups of data bits, each group of bits representing time periods of finer and finer resolution. The most significant group of bits represents delay as an integer number of periods of a system clock. The amount of delay specified by the most significant group of bits can be easily generated by counting an integer number of pulses of the system clock. The next most significant group of bits represents delay in intervals that are some fraction of the system clock. These bits are sometimes called the "fractional portion" of the timing data. This delay must be generated by an interpolator.

The timing edges from all of the timing generators 116 within a single channel are passed to a formatter 118. In addition to receiving timing edges, formatter 118 also receives other control information form test system controller 110. This control information might indicate the value of the test signal to be generated during a period, i.e. a logical 1 or a logical 0. It might specify other things such as the format of the signal applied to device under test 112. For example, formats such as "return to zero," "surround by complement," "return to one," and "non-return to zero" are all sometimes used. These formats might be imposed by formatter 118.

FIG. 1 shows a test system architecture that illustrates the role of timing generators 116. Other architectures are possible. The specific source of control information for the timing generators 116 and the specific use of the timing edges they generate is not critical to the invention.

Figure 2A:
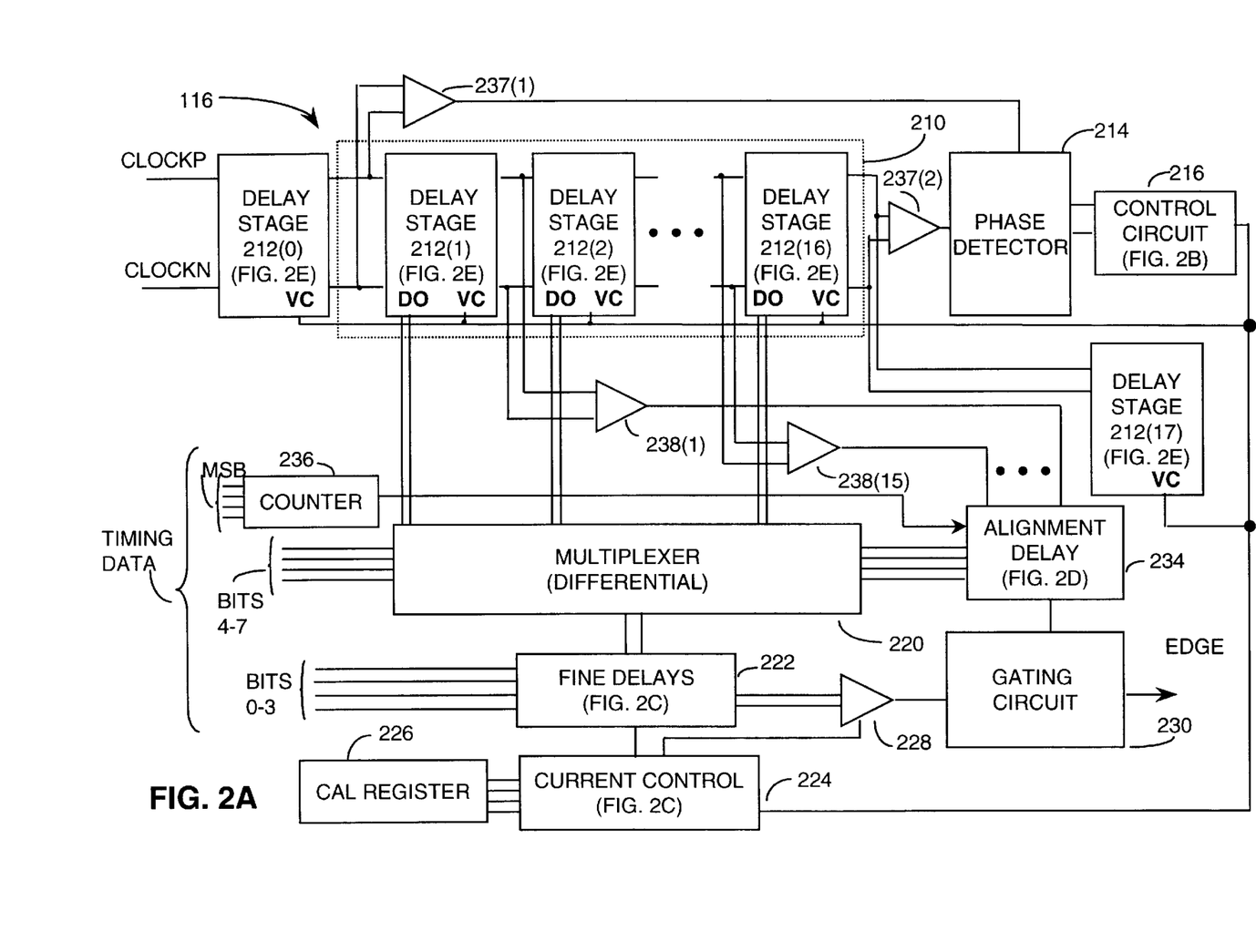
FIG. 2A is a simplified schematic of one timing edge generator in a test system of the invention.

Turning now to FIG. 2A, the circuitry of a timing generator 116 according to the invention is shown. Digital timing data from test system controller 110 is applied to timing generator 116. Timing generator 116 then produces a timing edge that is used by formatter 118 (FIG. 1) or elsewhere in the tester.

A digital delay line 210 is shown. The delay line is a preferably a CMOS delay line and more preferably a differential delay line. The stages of the delay line are shown in more detail in conjunction with FIG. 2E, below.

FIG. 2A shows that 16 delay stages 212(1) . . . 212(16) are cascaded in delay line 210. The input to delay line 210 is derived from a system clock, which is shown as a differential clock on lines CLOCKP and CLOCKN. Before application to delay line 210, the system clock is conditioned in delay stage 212(0). More than one delay stage could be used for conditioning. Delay stage 212(0) is like the other stages in delay line 210. In this way, the input of every delay stage 212(1) . . . 212(16) in delay line 210 receives an input signal from the same kind of circuitry. All of the delay stages 212(1) . . . 212(16) therefore receive inputs with the same voltage swing, which leads to less variation in delay from stage to stage.

In a preferred embodiment, the system clock has a frequency of 100 MHz. However, the frequency of the system clock is not critical to the invention and could even be variable. The system clock is preferably a highly stable clock and is routed to all timing generators 116 in tester 100.

The input and the output of delay line 210 are fed to phase detector 214 through differential to single ended buffer amplifiers 237(1) and 237(2), respectively. The output of phase detector 214 is fed to control circuit 216. Control circuit 216 produces control signals that are fed back to a control input, VC, in each delay stage 212. The control signal adjusts the delay through each delay stage 212. Delay line 210, phase detector 214 and control circuit 216 implement what is known as a Delay Locked Loop. The loop is said to be "locked" when the delay through delay line 210 equals one period of the system clock. In the embodiment of FIG. 2A, that results in each delay stage delaying the system clock by one sixteenth of a period of the system clock.

Phase detector 214 is as conventionally found in a delay locked loop. Control circuit 216 is similar to a charge pump as used in a conventional delay locked loop. However, it has been modified, as is explained below, to reduce the cross talk between interpolators.

The output D0 of each delay stage 212 is fed to a differential multiplexer 220. Multiplexer 220 selects the output of one of delay stages 212 as specified by certain bits of the timing data. In FIG. 2A, bits 4–7 represent the high order bits of the fractional portion of the timing data. Because the outputs of delay stages 212 are delayed by one sixteenth of the period of the system clock, the output of multiplexer 220 provides a clock signal that has been delayed by a multiple of one sixteenth of the system clock period.

To get finer resolution on the delay, the output of multiplexer 220 is passed to a fine delay circuit 222. Fine delay circuit 222 is controlled by bits 0–3 of the timing data. Bits 0–3 represent an additional delay that is a multiple of 1/256 of a period of the system clock. The operation of fine delay circuit 222 is described in greater detail in conjunction with FIG. 2C, below.

To provide greater accuracy, a current control circuit 224 is used in conjunction with fine delay circuit 222. The operation of current control circuit 224 is described below in conjunction with FIG. 2C. Current control circuit 224 receives a control input from a calibration register 226. As is known in the art, a tester is calibrated by programming a tester to generate a test signal at a specific time. The actual time at which the test signal is generated is measured to determine the difference between the desired time and the actual time at which the tester generates signals. Calibration values might be computed from this information. Alternatively, the calibration values are adjusted until the tester actually produces a test signal at the desired time and the calibration values that produces the desired result is stored. The contents of calibration register 226 is determined using a calibration process.

The output of fine delay 222 is a differential signal representing a delayed version of the system clock. It is delayed by a fraction of a period of the system clock. The delay is some multiple of 1/256 of the system clock period. The differential signal is applied to a differential to single ended converter 228. The output of differential to single ended converter 228 is applied to a gating circuit 230.

The input to gating circuit 230 is a clock signal, i.e. a train of pulses that occur at periodic intervals. It has merely been delayed relative to the system clock a programmed amount. To make a timing edge, one of the pulses must be selected. Gating circuit 230 selects the desired pulse to generate the required edge. Alignment delay circuit 234 provides a control signal that specifies which of the pulses is passed by gating circuit 230 to generate a timing edge at the appropriate time.

Alignment delay circuit 234 is described in greater detail in conjunction with FIG. 2D, below. Suffice it to say here that counter 236 receives the most significant bits, or integer portion, of the timing data. Counter 236 is reset by the T0 or beginning of cycle signal and then counts pulses of the system clock until the desired number of periods of the system clock has passed. When the required integer number of periods of the system clock has passed, counter 236 produces a terminal count signal that goes to alignment delay 234. Alignment delay 234 also receives as inputs bits 4–7 of the timing data and outputs from delay stages 212. The outputs of delay stages 212(1) . . . 212(16) are converted to single ended signals by differential to single ended converters 238(1) . . . 238(16). This information allows alignment delay circuit 234 to generate a control signal that enables gating circuit 230 to pass the desired pulse from the train of pulses produced by fine delay 222. Gating circuits that can pass a selected pulse from a pulse train are known in the art and need not be further described.

Figure 2B:
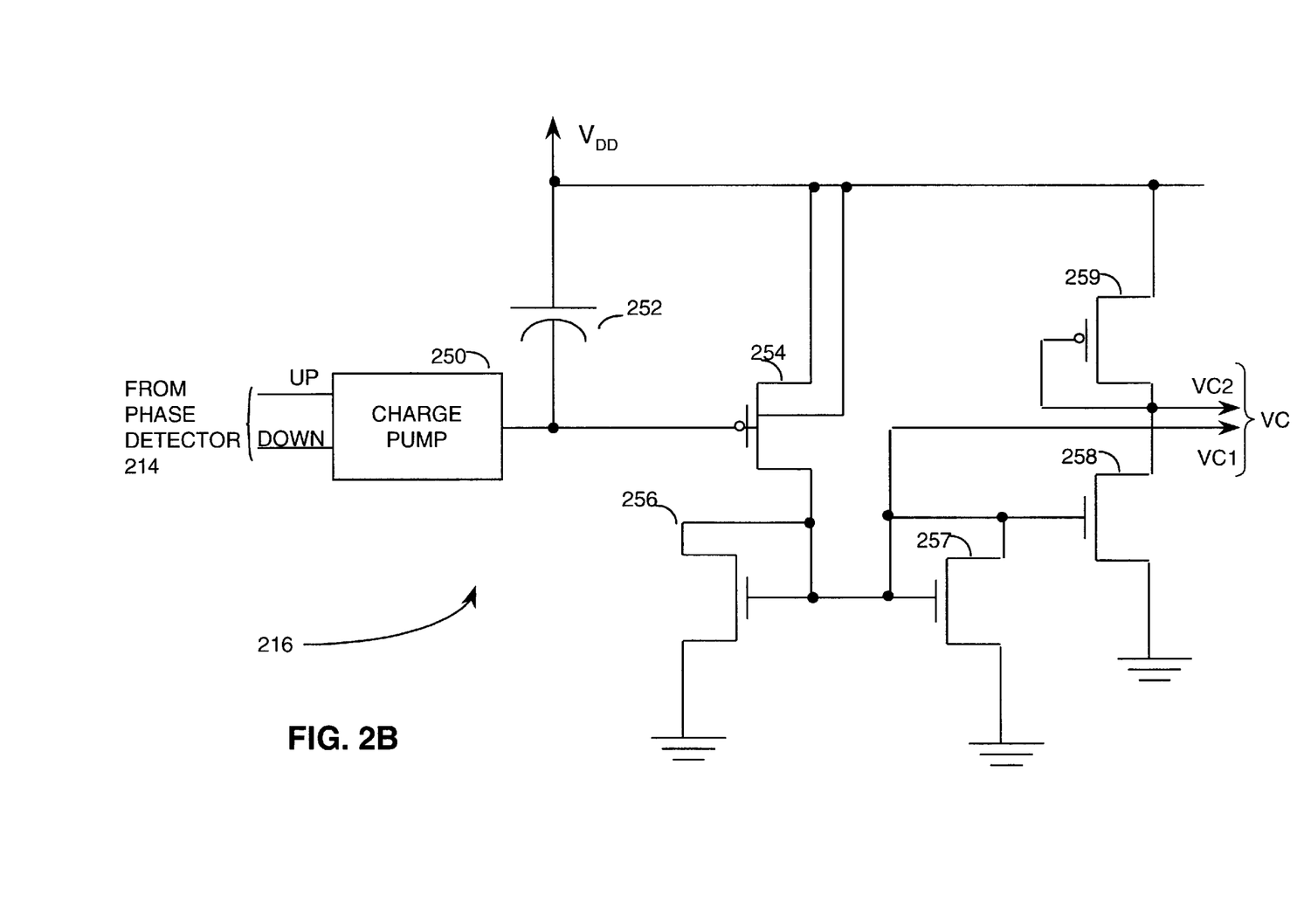
FIG. 2B is a simplified schematic of control circuitry shown in FIG. 2A.
Figure 2C:
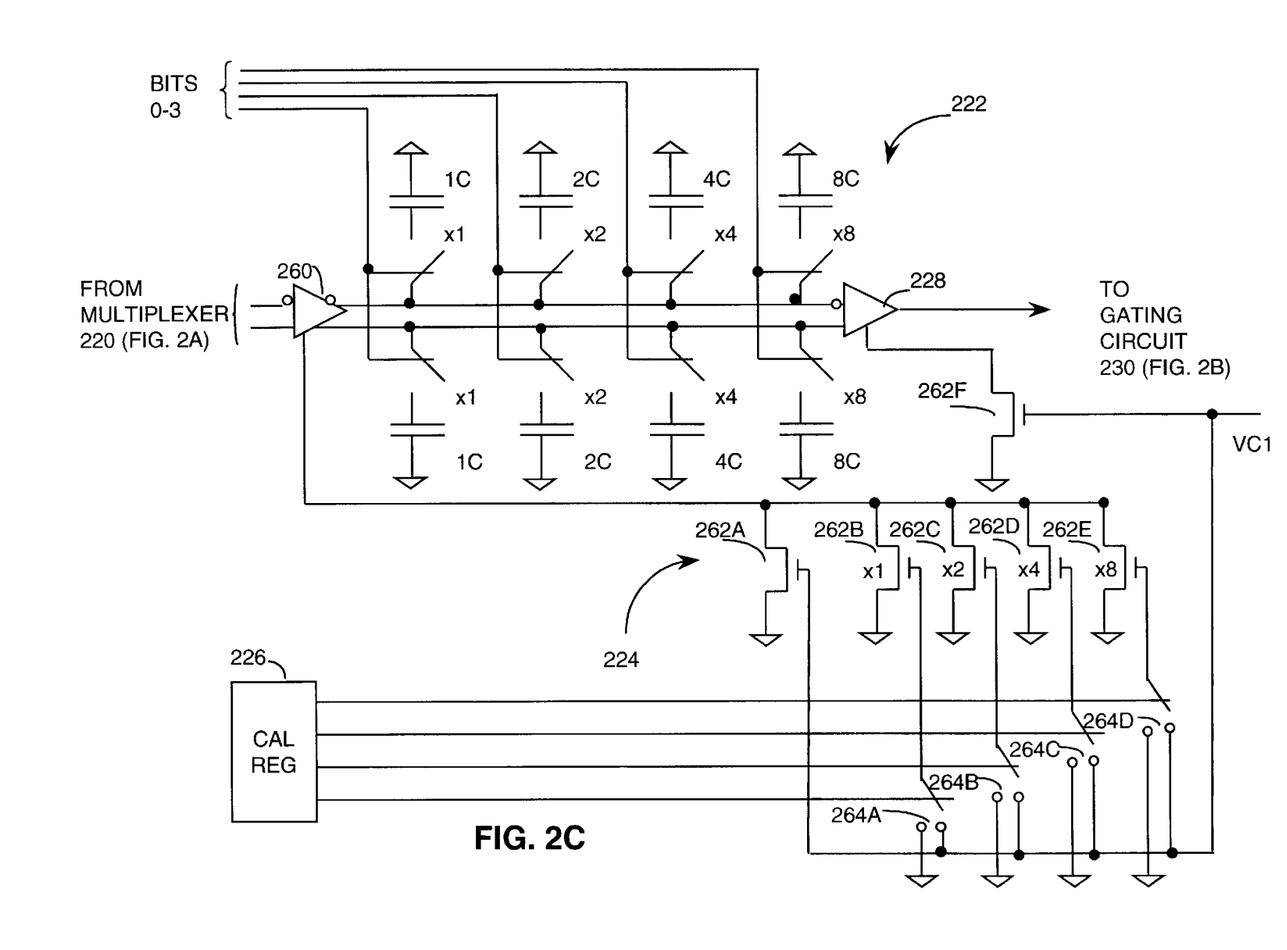
FIG. 2C is a simplified schematic of the fine delay and current control circuitry in FIG. 2A.
Figure 2D:
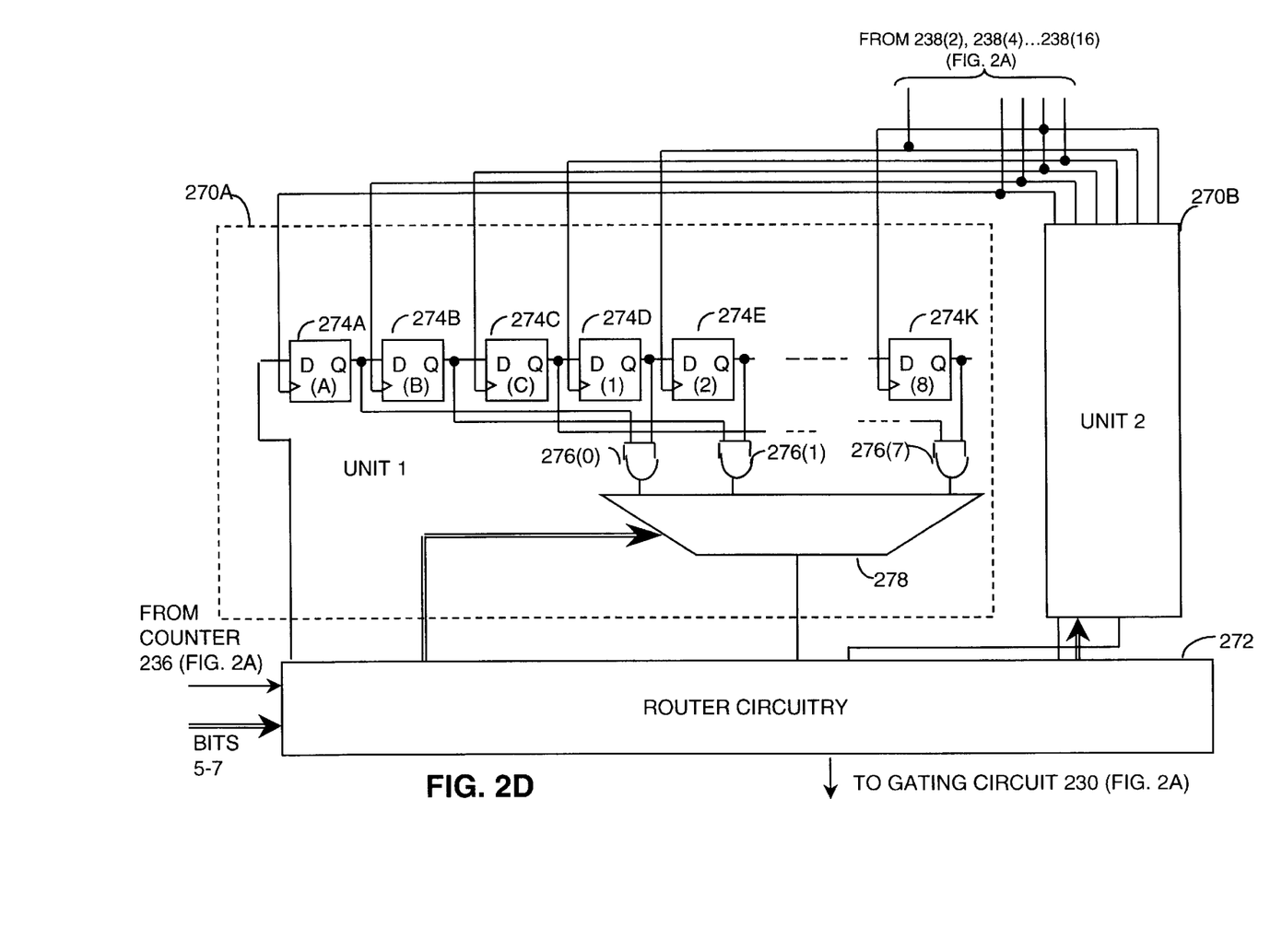
FIG. 2D is a simplified schematic of the alignment delay circuitry in FIG. 2A.
Figure 2E:
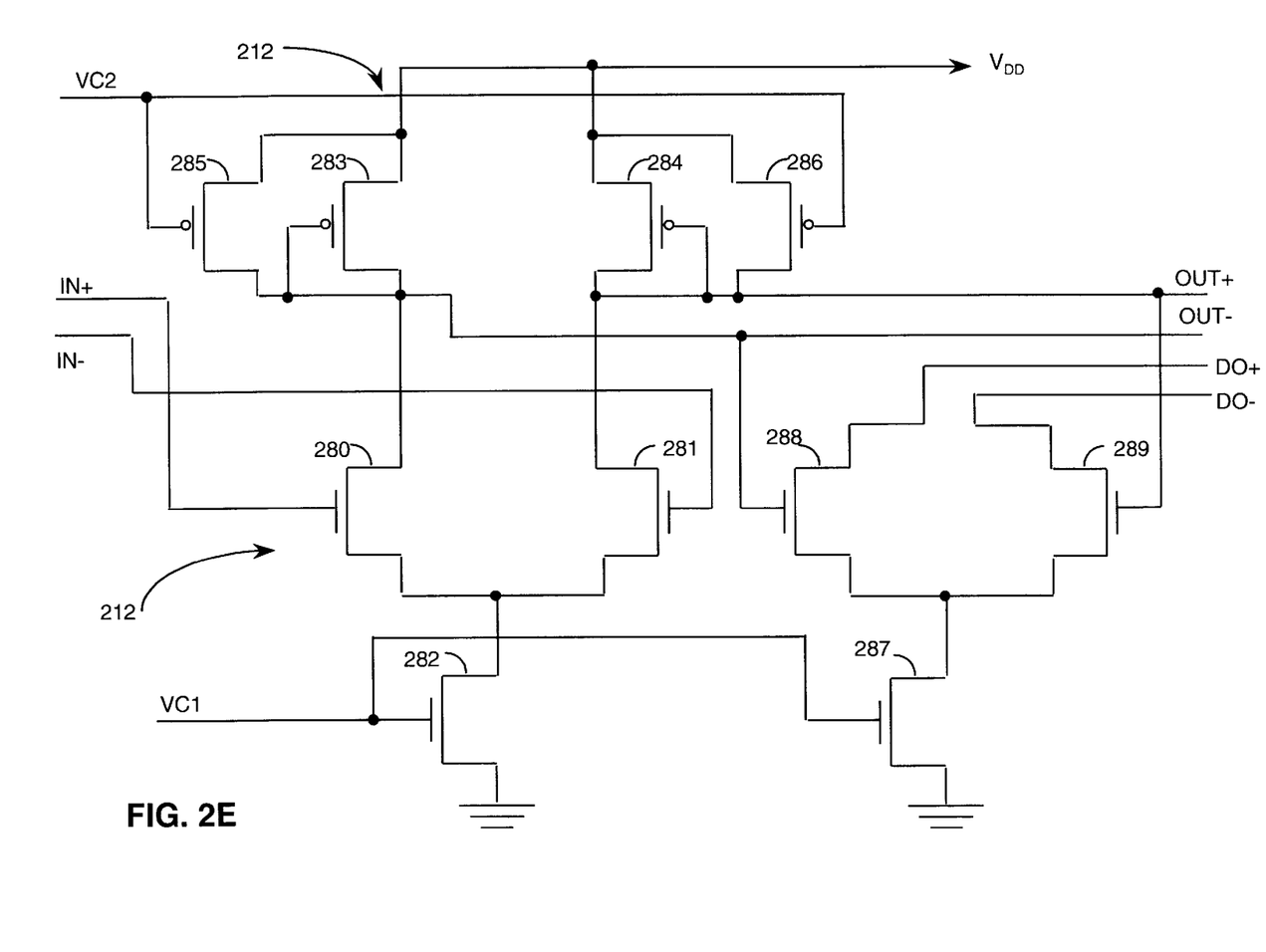
FIG. 2E is a simplified schematic of the delay stage circuitry of FIG. 2A.

Turning to FIG. 2E, details of a representative one of the delay stages 212(0) . . . 212(16) are shown. The terminals labeled IN+ and IN− represent a single differential input signal. The terminals labeled OUT+ and OUT− represent a single differential output signal. For delay stages 212(0) . . . 212(16), the terminals IN+ and IN− are connected to the terminals OUT+ and OUT−, respectively, of the preceding stage in the chain of delay stages as well as to a differential to single ended converter. For stage 212(0) the terminals IN+ and IN− are connected to the system clock as shown in FIG. 2A. For stage 212(16), the terminals OUT+ and OUT− are connected to differential to single ended converter 237(2) and to a dummy delay cell 212(17) as shown in FIG. 2A. The only purpose of 212(17) is to insure that 212(16) has the same loading as all of the preceding stages.

The input signal IN+ and IN− are applied to differential pair of transistors 280 and 281. Current in delay stage 212 is controlled by control signal VC1, which is derived from control circuit 216 in a manner described below in conjunction with FIG. 2B.

Transistors 283 and 284 act as loads for the differential pair of transistors 280 and 281. Transistors 285 and 286, which are connected in parallel with load transistors 283 and 284, are controlled by a control signal VC2, which is also derived from control circuit 216, as described below in conjunction with FIG. 2B.

Transistors 285 and 286 provide control over the voltage swing at terminals OUT+ and OUT− to ensure that the output signal has sufficient swing as the delay through delay stage 212 is adjusted by control signal VC1. As control signal VC1 decreases, the current through the delay cell decreases. Without transistors 285 and 286, a decrease in current would decrease the voltage drop across transistors 283 and 284. The decrease in voltage gives terminals OUT+ and OUT− a quiescent voltage that is closer to $V_{DD}$. Because the voltage at OUT+ and OUT− can never swing above $V_{DD}$, a quiescent voltage closer to $V_{DD}$ reduces the swing.

Therefore, as control signal VC1 decreases, control signal VC2 should increase, thereby tending to keep the quiescent voltage at OUT+ and OUT− reasonably constant. The swing at the outputs OUT+ and OUT− is therefore maintained over a wide range of values for VC1.

Transistors 288 and 289, in conjunction with transistor 287 buffer the signals at terminals OUT+ and OUT− so that they can interface with multiplexer 220 (FIG. 2A). The drains of transistors 288 and 289 are current mode connections to an input of multiplexer 220. Transistor 287 regulates current through those transistors in response to a control signal VC1.

Turning now to FIG. 2B, details of control circuit 216 are shown. Control circuit 216 includes charge pump 250 as is conventional in a prior art delay locked loop. The output of the charge pump is connected to capacitor 252. In a conventional delay locked loop, the other end of capacitor 252 is connected to ground to form what is essentially a low pass filter.

In control circuit 216, the other end of capacitor 252 is connected to $V_{DD}$, the voltage supply. The source terminal of transistor 254 is connected in parallel with capacitor 252. An "UP" signal from phase detector 214 indicates that the delay line 210 is running too fast. Charge pump 250 raises the output voltage in response to the "UP" signal from phase detector 214, which reduces the voltage drop across capacitor 252. Thus, the gate to source voltage of transistor 254 decreases the source current of transistor 254.

A "DOWN" signal from phase detector 214 has the opposite effect on the source current of transistor 254. Thus, the source current of transistor 254 indicate whether the delay through delay line 210 must be increased or decreased.

Transistor 256 is connected in series with transistor 254. As the source current increases in transistor 254, the drain to source current increases an equal amount in transistor 256. As the current flow in transistor 256 increases, the gate to source voltage of transistor 256 also increases. Thus, the gate to source voltage of transistor 256 is proportional to the voltage across capacitor 252. Because the voltage across capacitor 252 indicates whether the delay through delay line 210 (FIG. 2A) should be increased or decreased, the gate to source voltage of transistor 256 represents a signal that is proportional to the required adjustment of delay and is denoted VC1, which, as described above, is one element of the signal VC that controls delay through each of the delay stages 212 (FIG. 2A).

The second element of control signal VC is signal VC2, and is also generated by the circuitry shown in FIG. 2B. Transistors 257, 258 and 259 collectively make up a control signal mirror that develops a signal VC2 from VC1. The gate and drain of transistor 257 is tied to VC1. This point is tied to the gate of transistor 258, which ensures that the gate of transistor 258 tracks the level of signal VC1. The current through transistor 258 is therefore proportional to signal VC1. As transistor 259 is configured in series with transistor 258, its current likewise is proportional to VC1.

Transistor 259 has its gate and source tied together. Thus, as the signal VC1 increases and the current through transistor 259 increases, the voltage across transistor 259 increases and the source voltage, labeled VC2, decreases. With this configuration, the signal VC2 drops as VC1 increases, providing the desired relationship between the signals that make up control signal VC.

An important aspect of the signal VC is that, though it is related to the voltage across capacitor 252, it is largely independent of the actual value of $V_{DD}$. If $V_{DD}$ changes, the gate to drain voltage of transistor 254 will stay the same and the current through transistors 254 and 256 will likewise remain unchanged. Because the current flow through the transistors is what dictates the level of the control signal VC, the control signal is isolated from fluctuations in the value of $V_{DD}$.

This design provides reduced cross talk in comparison to the prior art. One way that transient signals cause cross talk is by creating fluctuations in $V_{DD}$. If the control signal of the delay locked loop is sensitive to changes in the value of $V_{DD}$, fluctuations in $V_{DD}$ create unintended changes in control signal, leading to timing inaccuracies. The timing inaccuracies are particularly bad if, for example, changes in $V_{DD}$ are actually used as a control signal to adjust delay. Control circuit 216 reduces cross talk by making the control signal VC independent of $V_{DD}$.

Turning to FIG. 2C, fine delay 222 is shown in greater detail. The differential output of multiplexer 220 (FIG. 2A) is applied to a differential buffer amplifier 260. The output of differential buffer amplifier 260 is applied as the input to differential to single ended converter 228.

The output of differential buffer amplifier 260 also has a series of pairs of capacitors switchably connected to it. The switchably connected capacitors form a variable load that can be used to control the switching speed of differential buffer amplifier 260 and thereby control the delay through fine delay circuit 222.

The capacitors are denoted 1C, 2C, 4C and 8C. The capacitors are sized in accordance with their numbers. Capacitor 2C is twice as large as capacitor 1C. Capacitor 4C is four times as large as capacitor 1C. Capacitor 8C is eight times as large as capacitor 1C. In a preferred embodiment, the sizing of the capacitors is achieved by simply using multiple capacitors to make larger capacitors. For example, 2 capacitors are used to make capacitor 2C and eight capacitors are used to make capacitor 8C.

The capacitors are implemented in pairs, with one capacitor of each size switchably connected to each of the inverted and non-inverted output of differential buffer amplifier 260. This configuration ensures that, upon a signal transition on the output of differential buffer amplifier 260, a constant capacitive load will be present regardless of whether the output is transitioning from a logic high to a logic low or from a logic low to a logic high.

The switches, denoted x1, x2, x4 and x8, that connect each of the capacitors 1 C, 2C, 4C and 8C can be simply implemented as switching transistors. The size of the switching transistors is adjusted so that the resistance of the switch varies in inverse proportion to the size of the capacitor to which it is connected. With this ratio of resistors and capacitors, the RC time constant associated with each capacitor/switch pair is the same. Thus, the change in delay introduced when a capacitor is switched to the output of differential buffer amplifier 260 depends only on the size of the capacitors 1C, 2C, 4C or 8C and not on the RC time constant of the circuit. Switches X1, X2, X4 and X8 can be implemented by wiring multiple switching transistors in parallel. Two transistors are used to make switch X2 and eight transistors are used to make switch X8.

The size of the resistors x1, x2, x4 and x8 and capacitors C1, C2, C4 and C8 is selected such that, when all four pairs of capacitors is switched to the output of differential buffer amplifier 260, the delay through fine delay 222 increases by one sixteenth of a period of the system clock. Thus, when just capacitors 1C are switched in, the delay should increase by 1/256 of the system clock period. The computation of resistance and capacitance values need not be exact if well known calibration and software correction techniques are employed.

The switches x1, x2, x4 and x8 are controlled by bits 0–3 of the timing data. In the described embodiment these bits indicate the amount of delay fine delay 222 should add in increments of 1/256 of a system clock period. With the appropriate sized capacitors, this result is achieved by having Bit 0 control the switch to capacitor 1C, Bit 1 control the switch to capacitor 2C, Bit 2 control the switch to capacitor 4C and Bit 3 control the switch to capacitor 8C.

FIG. 2C also shows details of current control circuit 224. Current control circuit 224 adjusts for variations in the switching speed of differential buffer amplifier 260 or differential to single ended converter 228. The speed of these circuits might change as a result in changes in ambient temperature or changes in on-chip temperature caused by power dissipation in the integrated circuit on which fine delay circuit 222 is implemented. Current control circuit 224 is needed specifically because fine delay stage 224 is not identical to delay stages 212 (FIG. 2B). Fine delay stage 224, because it is intended to make a fine delay adjustment, will have different delay characteristics than the delay stages 212 (FIG. 2B).

Current control circuit 224 operates on control signal VC1. Control signal VC1 is generated based on the propagation delay through delay line 210 (FIG. 2A). In particular, it is based on deviations of the delay from the designed value. Thus, if the circuits on the chip which contains delay line 210 and fine delay 222 have a delay that is different than the designed value, VC1 will have a value that is proportional to the difference. Thus, as the delay through the circuits on the chip changes, VC1 will also change. It is these changes in VC1 in response to changes in delay that allow VC1 to be used to adjust the delay in delay stages 212(1) . . . 212(16) to have the required delay in each stage.

Though the delay through fine delay 222 is not the same as the delay through any of the delay stages 212(1) . . . 212(16), the need for delay adjustment in fine delay 222 can be correlated through a calibration process to the required amount of adjustment in delay stages 212(1) . . . 212(16). Thus, control signal VC can not be used to control the delay in fine delay 222 but can be used in determining an appropriate control signal. Current control 224 determines the appropriate control signal from control signal VC based on a calibration value stored in calibration register 226.

Differential buffer amplifier 260 and differential to single ended converter 228 are implemented using a differential pair of transistors connected in a common source configuration. By controlling the combined current flow out the sources of the differential pairs, the switching speed, and therefore the delay, of differential buffer amplifier 260 and differential to single ended converter 228 can be regulated. Current control 224 is connected to the common source terminal of the differential pairs and therefore regulates the delay of fine delay 222.

To provide the required current, control signal VC 1 is applied through a series of switches 264A . . . 264D to the gate terminals of transistors 262B . . . 262E. When a switch 264A . . . 264D is closed, the drain to source current through the associated transistor 262B . . . 262E, respectively, will vary in response to changes in control signal VC1.

Transistor 262A is connected to VC1 without an intervening switch and always responds to changes in VC1.

The drains of all of the transistors 262A . . . 262E are tied together and connected to the common sources of the differential pair within differential buffer amplifier 260. The total current flowing through the differential pair equals the total current flow through the ones of transistors 262A . . . 262E that are connected to control signal VC 1 through a respective switch 264A . . . 264D.

The current flow through the differential pair of differential buffer amplifier 260 and differential to single ended converter 228 is thus proportional to control signal VC1, but the constant of proportionality can be adjusted by selectively closing some or all of the switches 264A . . . 264D. Because the switches are controlled by the value in calibration register 226, the value in calibration register 226 is therefore controlling the gain of the correction factor for delay in fine delay 222. Thus, as long as the delays in delay line 210 (FIG. 2A) and fine delay 222 are linearly correlated, which is true to a close approximation of circuits made on the same integrated circuit chip, differences in circuit design, layout or other factors that might prevent a single control signal from being used to control the delays in each can be used. Any errors that are introduced by using the same control signal to adjust the delay in delay line 210 and fine delay 222 can be corrected through a calibration process in which an appropriate value for calibration register 226 is determined.

In the preferred embodiment, transistors 262B . . . 262E are sized to provide different current gains. The gains are binary weighted to correspond to the bit positions in cal register 226. As shown in the figure, transistor 262C has a gain that is twice that of transistor 262B; 262D has a gain of 4 times 262B and 262E has a gain of 8 times 262B. The net effect of this weighting is to effectively multiply the control signal VC1 by the value in the calibration register 226. The value in calibration register 226 is selected through the calibration measurement process to provide the required delay through fine delay stage 222.

Because transistor 262A is set to be always on, it adds a fixed offset to the control current into differential amplifier 260. In a preferred embodiment, transistor 262A is sized to have a current gain that is approximately 3 times transistor 262B. Fine delay stage 222 and transistor 262A are designed such that, with all switches 264A . . . 264D open, the delay through fine delay stage 222 is slightly slower than the required delay of fine delay 222. Simulation or experimentation might be required to determine the correct sizes of the components. In a preferred embodiment, transistor 262B has a gain which is about one sixteenth the size of transistor 256 (FIG. 2B).

The delay through differential to single ended amplifier 228 can also be controlled by VC1. VC1 is connected to the gate of transistor 262F, which then regulates current through amplifier 228.

Turning now to FIG. 2D, details of alignment delay circuit 234 are shown. Alignment delay 234 has two identical units 270A and 270B. Units 270A and 270B generate a gating signal for successive cycles of the tester operation. Router circuit 272 directs control information to the appropriate one of the units 270A or 270B and gets the gating signal from the appropriate unit during each tester cycle. Router circuit 272 is thus just a simple switching circuit that alternates between the units each tester cycle.

Because units 270A and 270B are identical, details of only unit 270A are shown. For each cycle in which unit 270A is the active unit, it outputs a gating signal that is roughly centered around the pulse at the output of fine delay 222 (FIG. 2A) that represents the desired timing edge. In the preferred embodiment, the system clock has a period of 10 nanosecond. The gating signal has a duration of approximately 5 nanoseconds. In this way, just a single clock pulse is selected to provide the edge output of timing generator 116.

Unit 270A is made of a chain of flip-flops 274A . . . 274K. The input to the chain comes from counter 236 (FIG. 2A), routed through router circuitry 272. Until counter 236 counts the required delay in integer number of periods of the system clock, there is no output of unit 270A.

Each of the flip flops 274A . . . 274K is clocked by an output of a delay stage 212(1) . . . 212(16) (FIG. 2A). Because the accuracy of differential signals is not required in alignment delay 234, these outputs are converted to single ended signals by differential to single ended converters 238(1) . . . 238(16) (FIG. 2A). It is not necessary that outputs of all delay stages 212(1) . . . 212(16) be routed to alignment delay circuit 234. As will be described below, only the output of every other delay stage 212(1) . . . 212(16) is used by alignment delay 234. Thus, of the 16 possible outputs of delay line 210, only 8 are routed to alignment delay 234.

The clock input to flip flop 274A is connected to the signal from one of the delay stage 212(n). The clock input to flip flop 274B is connected to the signal from delay stage 212(n+2). Connections are made in this pattern to each subsequent flip flop until the delay from stage 212(16) is assigned to one of the flip flops. The pattern then wraps around, with the next flip flop, being connected to the output of delay stage 212(2). The value of n is chosen such that the delay from the start of delay line 210 (FIG. 2A) to delay stage 212(n) roughly equals the propagation delay from counter 236 to the input of flip flop 274A.

Because each delay stage 212(1) . . . 212(16) delays the system clock by $1/16$ of the period of the system clock, which is 0.625 nanoseconds in the example, the time difference between the signals that clock adjacent flip flops in the chain 274A . . . 274K is 1.25 nanoseconds. Thus, when a terminal count signal is generated by counter 236, the output of each flip flop in the chain 274A . . . 274K goes high at a time that increases in successive increments of 1.25 nanoseconds. In the preferred embodiment, the terminal count signal from counter 236 stays high for 10 nanoseconds. Thus, when counter 236 has counted to introduce the required delay, a series of 10 nanosecond pulses, spaced apart by 1.25 nanoseconds is generated by the chain of flip flops 274A . . . 274K. Two of these signals are selected to form the appropriate gating signal.

AND gates 276(0) . . . 276(7) each combine the outputs of two of the flip flops in the chain 274A . . . 274K. The flip flops combined by each of the AND gates 276(0) . . . 276(7) are selected to be spaced apart by four flip flops. Thus, the inputs to AND gate 276(0) are derived from flip flops 274A and 274D. The inputs to AND gate 276(1) are derived from flip flops 274B and 274E. The inputs to the remaining AND gates are selected according to this pattern.

Because the inputs to each of the AND gates 276(0) . . . 276(7) are spaced apart by four flip flops, and the delay between the pulses produced by each flip flop is 1.25 nanoseconds, the delay between the two inputs to each of the AND gates 276(0) . . . 276(7) is 5 nanoseconds. Each input pulse is 10 nanoseconds wide. With a relative delay of 5 nanoseconds between pulses, the overlap of the two pulses is approximately 5 nanoseconds. Thus, the output of each AND gate 276(0) . . . 276(7) is a pulse that is 5 nanoseconds wide. Each pulse is delayed relative to the preceding pulse by 1.25 nanoseconds.

The output of one of the AND gates 276(0) . . . 276(7) will be a pulse that is 5 nanoseconds wide, roughly centered around the required pulse at the output of fine delay 222 (FIG. 2A). Which of the outputs is the appropriate gating signal depends on which delay stage 212(1) . . . 212(16) was selected by multiplexer 220. If the output of delay stage 212(1) or 212(2) is selected by multiplexer 220, then the output of AND gate 276(0) is the appropriate signal. If the output of delay stage 212(3) or 212(4) is selected, then the output of AND gate 276(1) is the appropriate signal. The mapping continues in this pattern, with the output of AND gate 276(7) representing the appropriate gating signal when delay stage 212(15) or 212(16) is selected.

With this pattern, the timing bits that control the selection of an output of one of the delay stages 212(1) . . . 212(16)

also dictate which of the AND gates 276(0) . . . 276(7) is to be selected. Multiplexer 278 selects the appropriate output of the AND gates 276(0) . . . 276(7) based on the same timing bits. However, because the output of one AND gate is used to generate the appropriate gating signal for either of two delay stages, the lower order bit that is used to control multiplexer 220 is not needed to control multiplexer 278. Thus, FIG. 2D shows that timing bits 5–7 are applied to router circuit 272 and are then applied to multiplexer 278.

The output of multiplexer 278 is provided to router circuit 272. Router circuit 272 passes this signal through to its output and it is used as the gating signal for gating circuit 230. The falling edge of the signal out of multiplexer 278 also indicates that the required edge has been generated. Thus, unit 270A is no longer needed for that cycle of tester operation. Upon recognizing the falling edge, router circuit switches to unit 270B as the active unit. The falling edge of the output of multiplexer 278 can also be used for other purposes within timing generator 116. For example, timing data bits 0–7 should stay constant until that falling edge occurs. Therefore, the falling edge can be used to trigger a change in timing bits 0–7 from one cycle to the next.

Two units are 270A and 270B are used to allow a lower "refire recovery time." The refire recovery time indicates the minimum time difference that can be specified between consecutive edges from the same timing generator 116. In the preferred embodiment, with a 100 MHz system clock, the refire recovery time is less than 10 nanoseconds, or less than the period of the system clock. A low refire recovery time is important to allow highly flexible programming of test signal timing. If the refire recovery time is longer than one period of the system clock, there can be some settings for the length of a tester cycle in which an edge generator 116 might not be able to fire during each tester cycle. If the tester cycle length is set to its smallest value, that would, for the examples given herein, result in a tester cycle of 10 nsec. If the refire recovery time is longer than 10 nsec, that means if an edge generator produces an edge in one cycle, it will not be able to produce an edge in the next cycle. Shortening the refire recovery time greatly improves the flexibility of the tester.

With the embodiment of FIG. 2D, unit 270A generates the gating signal in one cycle. Unit 270B generates the gating signal in the next cycle. Thus, the refire recovery time is dictated by the time difference that has to pass between the time that unit 270A can generate a gating signal and unit 270B can generate a gating signal. In the preferred embodiment, the gating signals generated by units 270A and 270B are each 5 nanoseconds wide and centered around the programmed timing edge.

The refire recovery time might be made smaller by decreasing the time between the generation of the gating signals. However, it must be noted that the outputs of delay stages 212(1) . . . 212(16) are delay regulated through the use of a feedback signal VC. They are relatively insensitive to variations in temperature or other factors that might alter the delay through the circuitry of the timing generator. There is no such delay regulation in alignment delay 234. As a result, the relative time differences between the signals out of fine delay 222 and alignment delay 234 might vary by some small amount. For that reason, each gating signal is made, for the numerical examples given herein, 5 nanoseconds wide.

In addition, there is a need for the output of fine delay 222 to come to steady state after a change in timing data. In a preferred embodiment, this takes a maximum of 5 nanoseconds. Thus, it is necessary that the end of one gating signal and the start of the next gating signal be separated in time by at least this settling time. By combining these numbers, the resultant refire recovery time comes to a maximum 10 nanoseconds in the preferred embodiment.

It should be noted that control signal VC could also be used to regulate the delay through alignment delay 234 in a similar fashion to the way it is used to regulate delay through fine delay 222 or delay stages 212. The width of each gating pulse could then be made smaller by ANDing together in AND gates 276(0) . . . 276(7) outputs of flip flops that have a close spacing than is shown in FIG. 2D.

Figure 3:
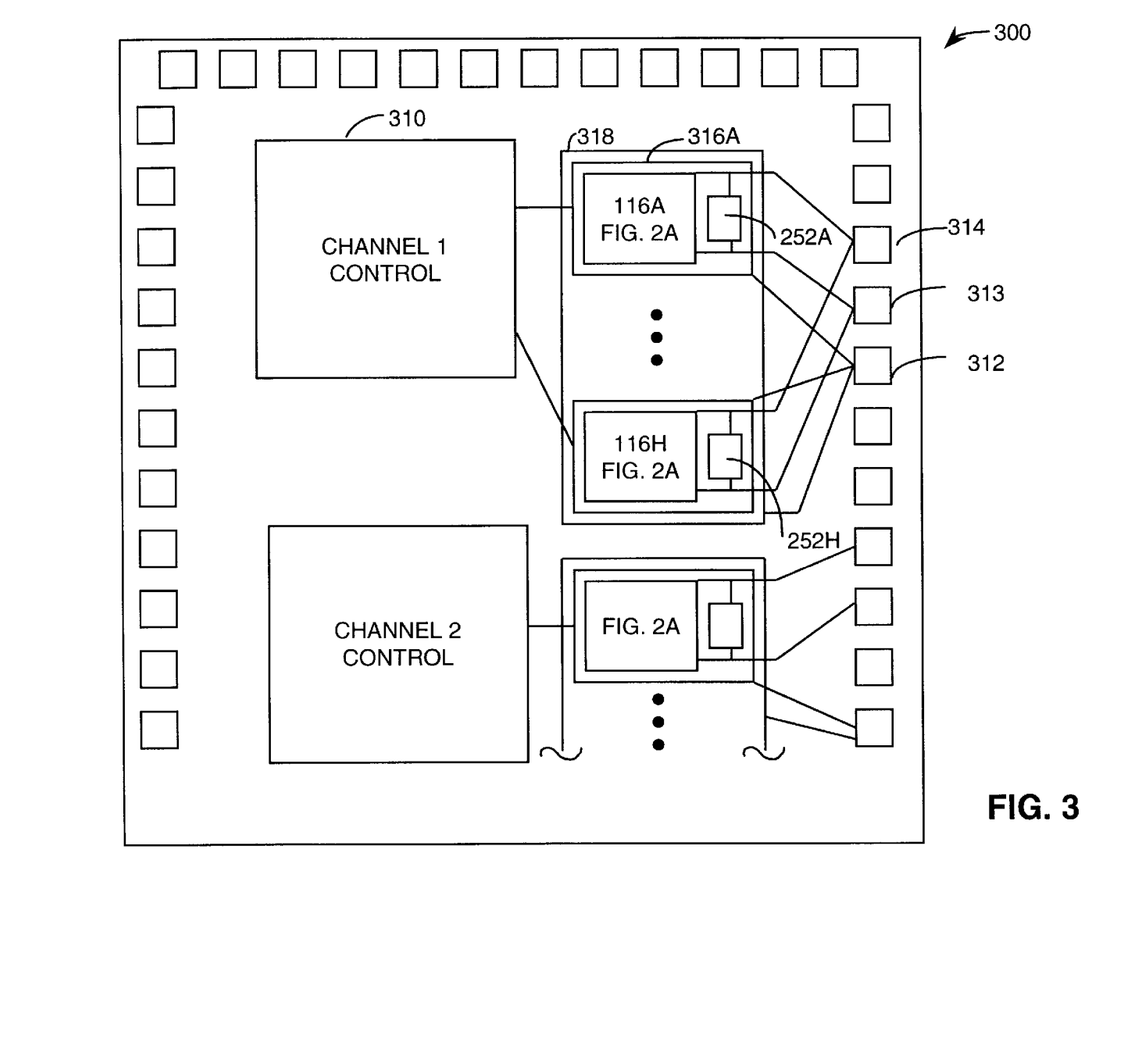
FIG. 3 is block diagram illustrating power, ground and shielding connection of multiple timing generators on a single integrated circuit chip.

Turning now to FIG. 3, implementation on a single integrated circuit chip of timing generators 116 for a plurality of channels 114 (FIG. 1) is illustrated. FIG. 3 shows a portion of an integrated circuit chip 300 to schematically illustrate the placement of circuitry on the chip. In a preferred embodiment, chip 300 is a CMOS chip implemented using standard design techniques. In the preferred embodiment, chip 300 has a die size of 14.5 mm square.

A plurality of interpolators, such as 116 (FIG. 2A) are fabricated on chip 300. In the preferred embodiment, interpolators for four channels are implemented on chip 300. A test system might include many such chips so that numerous channels are provided within the test system. In the preferred embodiment, there are eight interpolators 116A . . . 116H per channel. The entire circuitry of FIG. 2A is repeated for each interpolator, with the exception of cal register 226, which, in the preferred embodiment, is repeated once for each channel.

Control circuitry 310 represents the digital circuitry needed to control the interpolators and is conventional circuitry. Counter 236 and alignment delay 234 are all part of this control circuitry 310.

The interpolators 116A . . . 116H for a single channel are enclosed within a guard ring 318. Guard ring 318 prevent signals from interpolators in one channel from interfering with the interpolators in another channel. It therefore reduces inter-channel cross talk. Each interpolator is surrounded by a guard ring 316A . . . 316H. These guard rings reduce intra channel cross talk. Fabrication of guard rings is described in greater detail in conjunction with FIG. 4, below. Guard rings 318 and 316A . . . 316H also prevent interference generated by digital control circuitry 310 from reaching interpolators 116A . . . 116H

Each interpolator 116A . . . 116H has its own capacitor 252A . . . 252H associated with it. We have found that, where all interpolators within a channel share a single capacitor, delay line 210, phase detector 214 and control circuit 216, greater cross talk resulted. Therefore, significantly less cross talk results from using a separate capacitor, delay line and associated control circuitry for each channel.

FIG. 3 also illustrates that separate ground, isolation and power connections are used for each channel. Isolation I/O pads 312 make connection to guard rings 318 or 316A . . . 316H. Further, the ground, isolation and power lines are kelvin connected to I/O pads of chip 300. In particular, ground and power connections are routed through individual traces to the 1/0 pads 312, 312 and 314. Using separate traces reduces cross coupling between the circuits that are connected through those traces. Where two circuits share a common line though which current flows, such as power or ground, current flow along the common line creates a voltage drop across the line. Changes in voltage drop caused by changes in current flow from one circuit appears to the other circuit as noise on the common line. This noise represents cross coupling. Because the isolation lines are not intended to carry large amounts of current, it is not necessary that they be kelvin connected. However, om some embodiments, cross talk can be reduced further by kelvin connection the isolation lines to 1/0 pads.

Though the isolation line is connected to ground, using a separate isolation line further reduces the cross coupling. FIG. 3 shows that all of the power lines for the interpolators in channel 1 are connected to I/O pad 314. All of the ground lines for the interpolators in channel 1 are connected to I/O pad 313. All of the isolation lines for interpolators in channel 1 are connected to 1/O pad 312. Similar connections are made to other pads for each of the other channels on chip 300.

Figure 4:
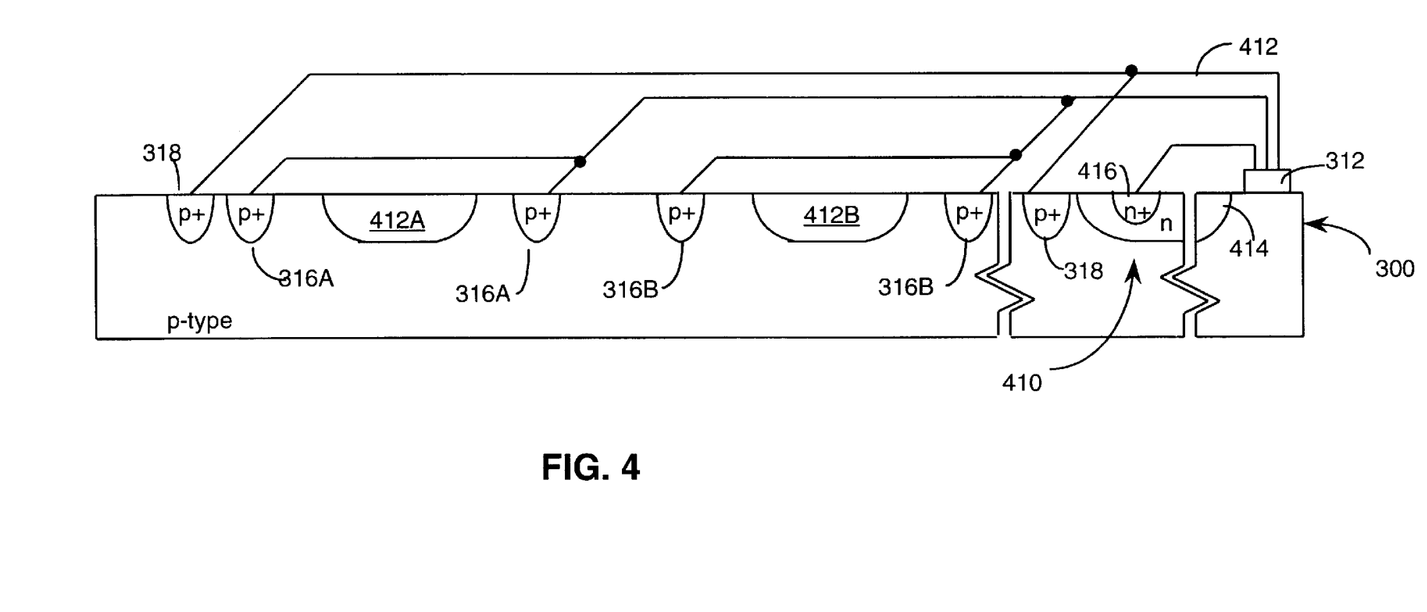
FIG. 4 is a simplified diagram illustrating implementation of edge generator shielding for multiple edge generators within a channel.

Turning to FIG. 4, details of the implementation of the ground bands are shown. Chip 300 is shown with a p-type substrate. Various regions are shown in which actual circuits are made according to standard design techniques. In FIG. 4, region 412A holds interpolator 116A. Region 412B holds interpolator 116B. Other regions (not shown), hold other circuits.

Guard rings 318, 316A and 316B are made by doping p+type troughs around the appropriate circuit regions. The troughs encircle the circuit elements as shown in FIG. 3. These doped regions are then connected to I/O pad 312 using metallic traces 412 across the surface of chip 300.

FIG. 4 shows a further enhancement incorporated into chip 300. In region 410, the metallic traces for power, ground and isolation are routed to their pads. Region 410 is along the periphery of chip 300. Within the substrate of chip 300 below routing region 410 a further guard layer is employed. An n-type region 414 is doped into the substrate. An n+ region 416 is formed within region 414. The n+ region 416 is tied to ground pad 312. In this way, region 414 acts as a further barrier to noise that might induce cross talk. A primary purpose of region 414 is to isolate the metallic traces 412 from digital noise, such as might be generated by control circuits 310. Preferably, guard layer 410 will extend below substantially all of the routing region.

By employing guard regions, such as 316, 318 or 414, the timing errors in the interpolators caused by cross talk are greatly reduced. Reducing the cross talk allows multiple channels to be placed on a single chip. Increasing the number of channels on a single chip has great advantages. It reduces the overall size and cost of the test system dramatically. Much of the cost of a test system is in the circuitry needed to implement the channels. By putting more channels on one chip, the amount of circuitry is reduced. Fewer traces are required on the printed circuit boards. As a result, fewer or smaller printed circuit boards.

Having described one embodiment, numerous alternative embodiments or variations might be made. For example, several techniques are shown for reducing the cross talk of a tester with high channel density. Not all techniques need to be used simultaneously. The techniques might be used independently to obtain significant advantage.

Moreover, in some instances circuit elements are shown down to the transistor level. One of skill in the art will appreciate that other transistor layouts might be equivalent to the specifics disclosed.

Also, it was described that four tester channels are fabricated on each CMOS chip. Any number of channels might be implemented on a single chip, though preferably there will be more than two channels per chip. However, four or a higher number of channels is more preferred.

In addition, it is not necessary that the chips be CMOS. CMOS is the preferred implementation because it is widely available. However, other semiconductor technologies could be used. Some might be preferable for other applications. For example, GaAs circuitry might be preferred for higher speed test systems operating at system clock rates of 400 MHz or higher.

Another possible variation is the number of interpolators for each timing generator. Eight edges are described for each timing generator. Fewer edges might be used. For example, some automatic test equipment is made with as few as three timing edges per timing generator. More than eight timing edges are possible. More timing edges allows greater flexibility in programming the automatic test equipment.

As an example of another variation, FIG. 2B shows that a control signal is generated based on the voltage across capacitor 252, which acts as a filter capacitor. The improvement of FIG. 2B therefore makes the control signal less susceptible to noise on the power trace because the filtered output signal is taken to be the voltage across the capacitor 252. Traditionally, such a capacitor would be connected to ground and the filtered output signal would be taken to the voltage level at one terminal of the capacitor. Even if capacitor 252 had one terminal tied to ground instead of to $V_{DD}$, advantages of the invention might be obtained with a circuit design that derived the control signal from the voltage across capacitor 252.

Also, it was described that guard rings are formed by doping p+type impurities into the substrate. Other methods of forming guard rings might also be employed. The guard rings should preferably be conductive, but isolated from circuits on the chip by a reverse biased semiconductor junction. For example, if an n-type substrate were used, an n+type impurity might be employed to form guard rings.

Therefore, the invention should be limited only by the spirit and scope of the appended claims.

What is claimed is:

1. Automatic test equipment for testing semiconductor devices, comprising:

a) a clock producing a periodic stream of pulses;

b) a programmable counter, coupled to the clock and having a terminal count output;

c) a plurality of delay stages each having an input and an output, the plurality of delay stages being linked to form at the outputs a plurality of signals containing periodic pulses, the periodic pulses of each signal delayed relative to the periodic pulses of the signals at the other outputs;

d) programmable selection circuitry coupled to the outputs of the plurality of delay stages having an output selectively coupled to one of the outputs of the plurality of delay stages;

e) a programmable fine delay stage coupled to the output of the programmable selection circuitry;

f) gating circuitry, connected to the output of the fine delay stage and having a control signal input;

g) a control signal generating circuit having an input connected to the terminal count output of the counter and an output coupled to the control signal input of the gating circuit, the control signal circuit having a plurality of inputs coupled to the outputs of selected ones of the delay stages, the control signal generating circuit having a means for producing in response to the terminal count output of the counter, a series of pulsed signals delayed in proportion to the relative delay of the selected ones of the outputs of the delay stages.

2. The automatic test equipment of claim 1 wherein the control signal generating circuit additionally comprises logic circuitry responsive to a digital input, said logic circuitry having a pulsed output signal with a pulse duration contemporaneous with the overlap of selected ones of the pulsed signals.

3. The automatic test equipment of claim 2 wherein said logic circuitry comprises a plurality of logic gates, each of which has at least two inputs and one output, with two of the pulsed signals connected to the inputs of the logic gate, said logic circuitry further comprising a multiplexer having a plurality of inputs and an output, the plurality of inputs being connected to the outputs of the plurality of logic gates and the output being coupled to the output of the control signal generating circuit.

4. The automatic test equipment of claim 1 wherein the means for producing a series of pulsed signals comprises a chain of delay elements receiving as an input to the chain the terminal count output of the counter with each delay element further having a clock input, with the clock input of each delay element being coupled to one of the plurality of signals containing periodic pulses.

5. The automatic test equipment of claim 4 additionally comprising a second chain of delay elements and a router circuit for selectively directing the terminal count output of the counter to one of the chains of delay elements.

6. The automatic test equipment of claim 4 additionally comprising a plurality of multiplexers, with a multiplexer having inputs connected to the outputs of the delay elements in each chain of delay elements, and wherein the router circuit additionally comprises means for directing the output of one of the plurality of multiplexers to the output of the control signal generating circuit.

7. The automatic test equipment of claim 1 wherein the outputs of selected ones of the delay stages coupled to the control signal generating circuit consist of one half or less of the outputs of the plurality of delay stages.

8. Automatic test equipment for testing semiconductor devices, comprising:

a) a clock producing a periodic stream of pulses;

b) a programmable counter, coupled to the clock and having a terminal count output;

c) a plurality of delay stages each having an input and an output, the plurality of delay stages being linked to form at the outputs a plurality of signals containing periodic pulses, the periodic pulses of each signal delayed relative to the periodic pulses of the signals at the other outputs;

d) programmable selection circuitry coupled to the outputs of the plurality of delay stages having an output selectively coupled to one of the outputs of the plurality of delay stages;

e) a programmable fine delay stage coupled to the output of the programmable selection circuitry;

f) gating circuitry, connected to the output of the fine delay stage and having a control signal input;

g) a control signal generating circuit having an input connected to the terminal count output of the counter and an output coupled to the control signal input of the gating circuit, the control signal circuit having a plurality of inputs coupled to the outputs of selected ones of the delay stages, the control signal generating circuit having a plurality of like units and a router circuit having an input coupled to the terminal count output of the counter and outputs connected to each of the like units and circuitry that routes selective occurrences of the terminal count output of the counter to one of the plurality of like units.

9. The automatic test equipment of claim 8 wherein each of the like units comprises a series of clocked delay elements with clock inputs, each such delay element having its clock input connected to a selected output of a delay stage.

10. The automatic test equipment of claim 8 wherein the output of the control signal generating circuit has a leading edge and a trailing edge and the router circuit includes means for changing the routing of the clock input signal in response to the trailing edge of the output of the control signal.

11. The automatic test equipment of claim 8 wherein the control signal generating circuit additionally has a digital data input and the router circuit additionally comprises means for selectively routing the digital data input to one of the plurality of like units.

12. The automatic test equipment of claim 8 wherein each of the like units comprises:

a) a series of clocked delay elements with clock inputs, each such delay element having its clock input connected to a selected output of a delay stage;

b) a plurality of logic gates, each with at least two inputs and an output, each gate having inputs connected to two of the delay elements; and c) a multiplexer having a plurality of inputs, each input connected to the output of one of the logic gates and the output of the multiplexer connected to the router circuit.

13. The automatic test equipment of claim 12 wherein the logic gates are AND gates.

14. A method of operating automatic test equipment for testing semiconductor devices, comprising the steps of:

a) generating a plurality of periodic signals containing periodic pulses, the plurality of signals having different relative delays;

b) selecting, in response to a programmable value, one of the plurality of periodic signals;

c) further processing the selected periodic signal, said further processing including gating, in response to a gating signal having a leading and a trailing edge, a portion of the selected periodic signal to make an edge signal, the portion falling between the leading and trailing edge of the gating signal;

d) initiating a change of the programmable value for the step of selecting upon the occurrence of the trailing edge of the gating signal.

15. The method of operating automatic test equipment of claim 14 wherein the step of further processing additionally comprises delaying the selected periodic signal by a programmable amount.

16. A method of operating automatic test equipment for testing semiconductor devices to generate edge signals in successive periods, comprising the steps of:

a) generating a plurality of periodic signals containing periodic pulses, the plurality of signals having different relative delays;

b) selecting, in response to a programmable value, one of the plurality of periodic signals;

c) further processing the selected periodic signal, said further processing including gating, in response to a gating signal, a portion of the selected periodic signal to make an edge signal, the portion falling between the leading and trailing edge of the gating signal, wherein the gating signal is generated using different circuitry in successive periods.

17. The method of claim 16 wherein the step of further processing includes generating a terminal count signal for each period and producing a gating signal in response to each terminal count signal.

* * * * *